United States Patent
Ohuchi et al.

(10) Patent No.: US 6,573,598 B2
(45) Date of Patent: *Jun. 3, 2003

(54) SEMICONDUCTOR DEVICE AND METHOD OF FABRICATING THE SAME

(75) Inventors: Shinji Ohuchi, Tokyo (JP); Harufumi Kobayashi, Tokyo (JP); Yasushi Shiraishi, Tokyo (JP)

(73) Assignee: Oki Electric Industry Co, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/542,291

(22) Filed: Apr. 4, 2000

(65) Prior Publication Data

US 2002/0167085 A1 Nov. 14, 2002

(30) Foreign Application Priority Data

Apr. 6, 1999 (JP) ............................................ 11-098589
Mar. 10, 2000 (JP) ....................................... 2000-066919

(51) Int. Cl.[7] .............................................. H01L 23/48
(52) U.S. Cl. ...................... 257/734; 257/738; 257/780
(58) Field of Search ................................. 257/738, 778, 257/78, 734, 737, 780

(56) References Cited

U.S. PATENT DOCUMENTS

| | | | | |
|---|---|---|---|---|
| 5,656,863 A | * | 8/1997 | Yasunaga et al. | 257/778 |
| 5,672,912 A | * | 9/1997 | Aoki et al. | 257/693 |
| 5,757,078 A | * | 5/1998 | Matsuda et al. | 257/737 |
| 5,977,641 A | * | 11/1999 | Takahashi et al. | 257/778 |
| 6,011,312 A | * | 1/2000 | Nakazawa et al. | 257/778 |
| 6,147,413 A | * | 11/2000 | Farnworth | 257/779 |
| 6,181,010 B1 | * | 1/2001 | Nozawa | 257/737 |
| 6,191,487 B1 | * | 2/2001 | Rodenbeck et al. | 257/778 |
| 6,229,209 B1 | * | 5/2001 | Nakamura et al. | 257/737 |
| 6,262,473 B1 | * | 7/2001 | Hashimoto | 257/668 |
| 6,271,588 B1 | * | 8/2001 | Ohuchi | 257/734 |
| 6,281,591 B1 | * | 8/2001 | Nakamura | 257/778 |
| 6,287,893 B1 | * | 9/2001 | Elenius et al. | 438/108 |
| 6,313,532 B1 | * | 11/2001 | Shimoishizaka et al. | 257/734 |

FOREIGN PATENT DOCUMENTS

| | | | | |
|---|---|---|---|---|
| JP | 08064725 | | 3/1996 | |
| JP | 10050772 | | 2/1998 | |
| JP | 10098045 | | 4/1998 | |
| JP | 10-359229 | * | 12/1998 | .................. 257/778 |
| JP | 11-029479 | * | 2/1999 | .................. 257/734 |
| JP | 11-065157 | * | 11/1999 | .................. 257/778 |

OTHER PUBLICATIONS

"Super CSP: A BGA Type Real Chip Size Package Using a New Encapsulation Method"; *Proceeding of the Pan Pacific Microelectronics Symposium;* Nikkei Microdevices 1998; p. 164–166 with partial English translation.

"Chip Size Package"; Nikkei Microdevices 1998; p. 49–50 with partial English translation.

Nikkei Electronics 1999; No. 738; p. 174 and 175.

\* cited by examiner

Primary Examiner—Jerome Jackson
Assistant Examiner—Lourdes Cruz
(74) Attorney, Agent, or Firm—Rabin & Berdo, P.C.

(57) ABSTRACT

A semiconductor device is disclosed which includes a semiconductor chip having a plurality of electrode pads on its upper surface; terminals such as copper posts formed on the upper surface of the semiconductor chip, and electrically connected to each of the electrode pads; a resin deposited on the upper surface of the semiconductor chip, encapsulating the terminals but exposing at least some of them to a predetermined height; and electroconductor members such as solder balls connected to the terminals. There is also disclosed a method of fabricating such a semiconductor device.

22 Claims, 12 Drawing Sheets

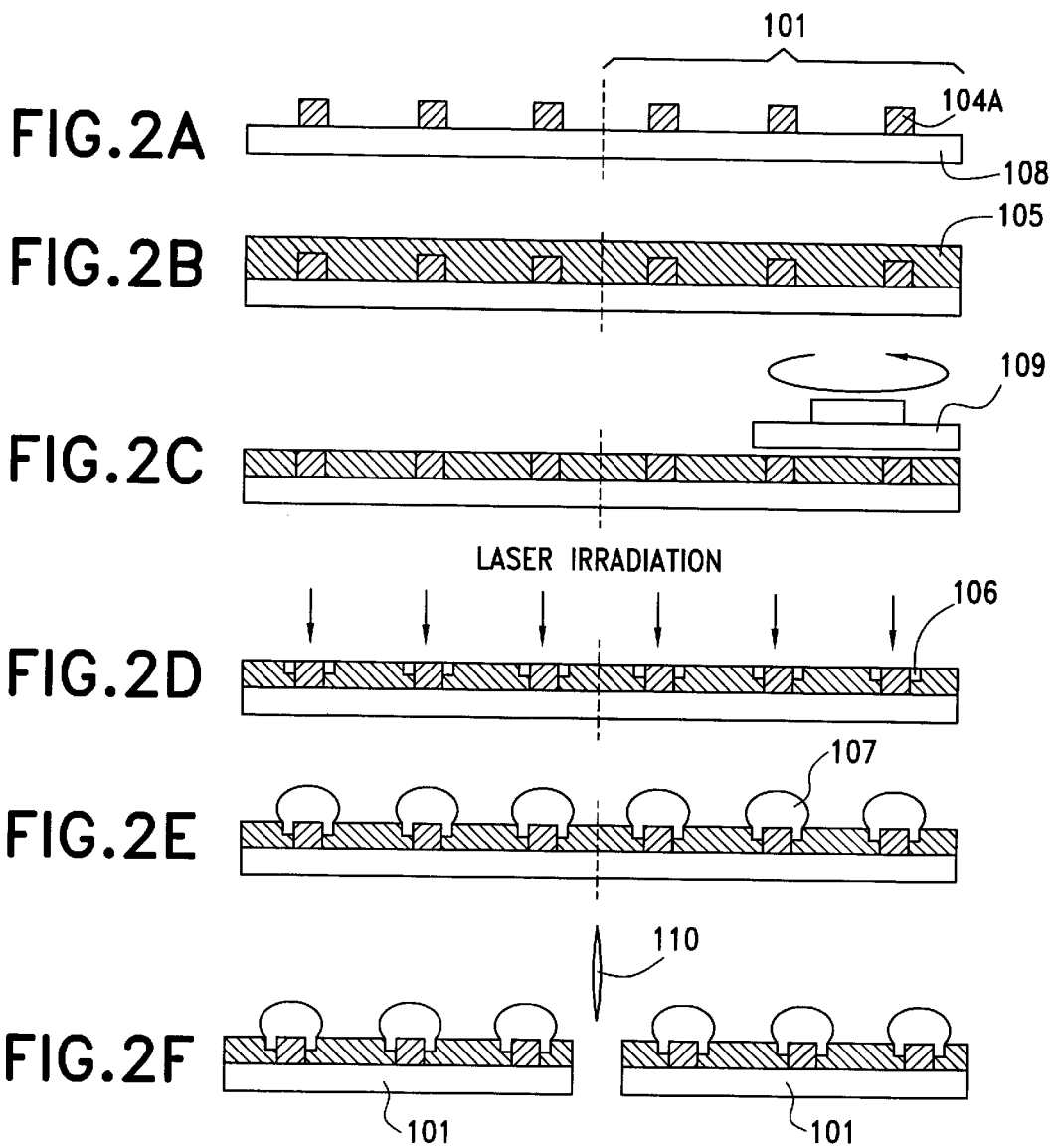

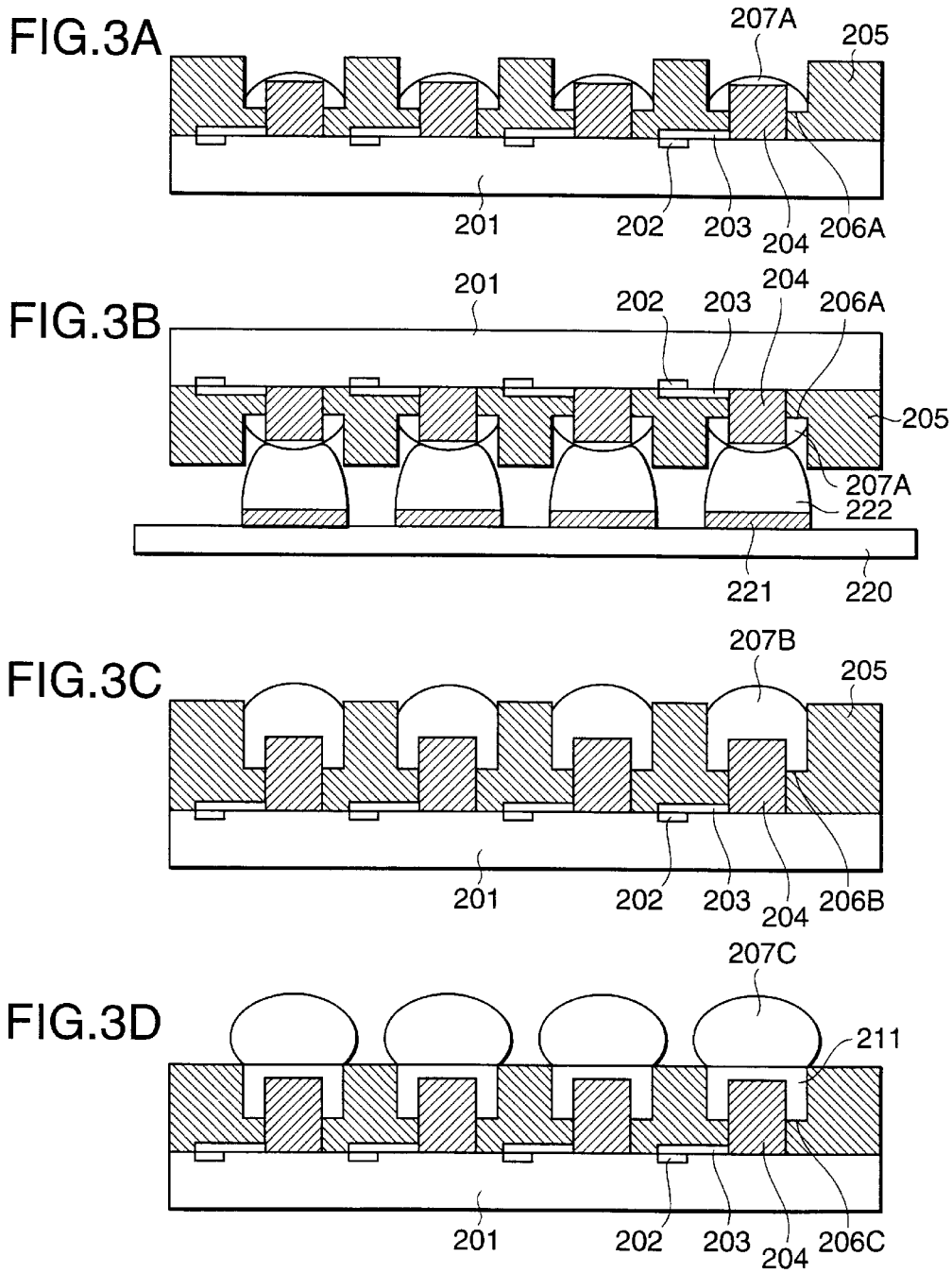

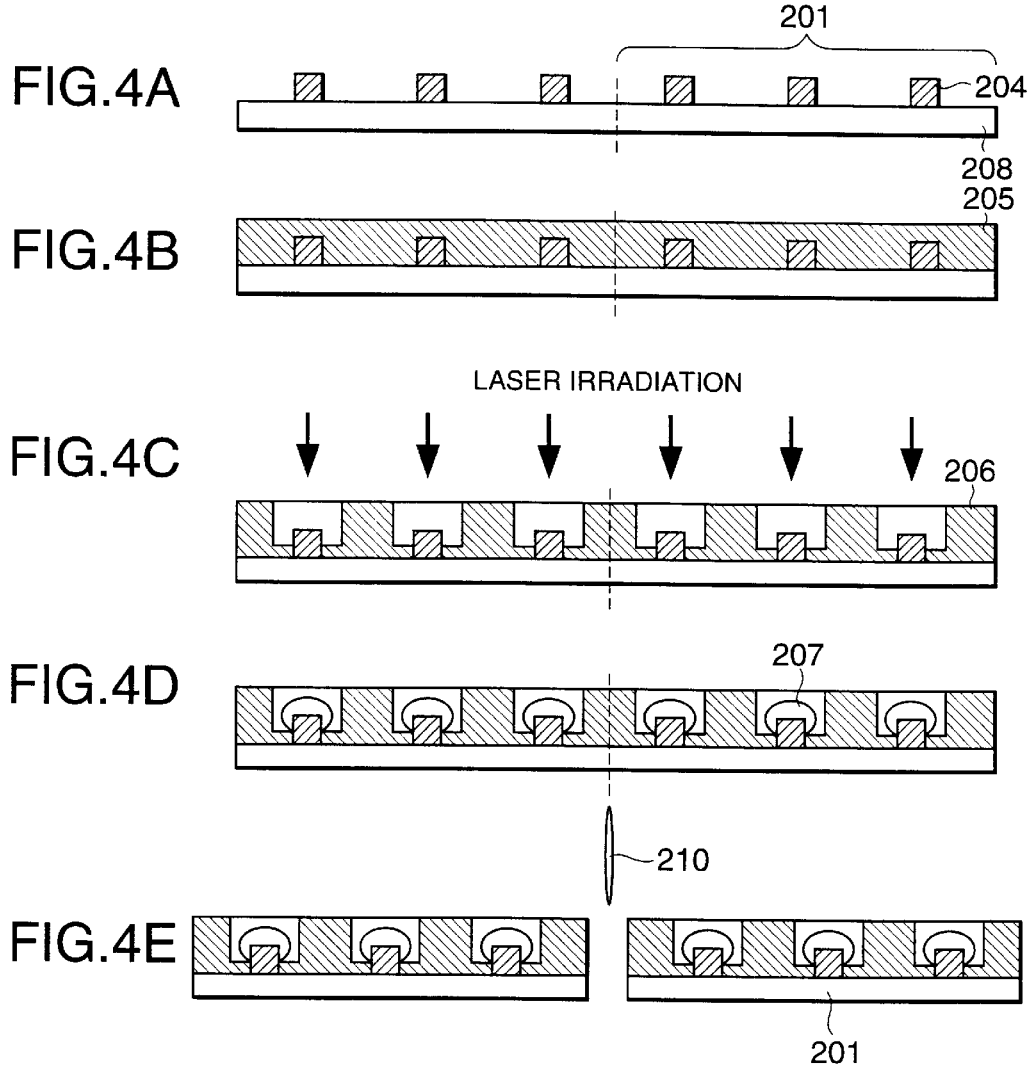

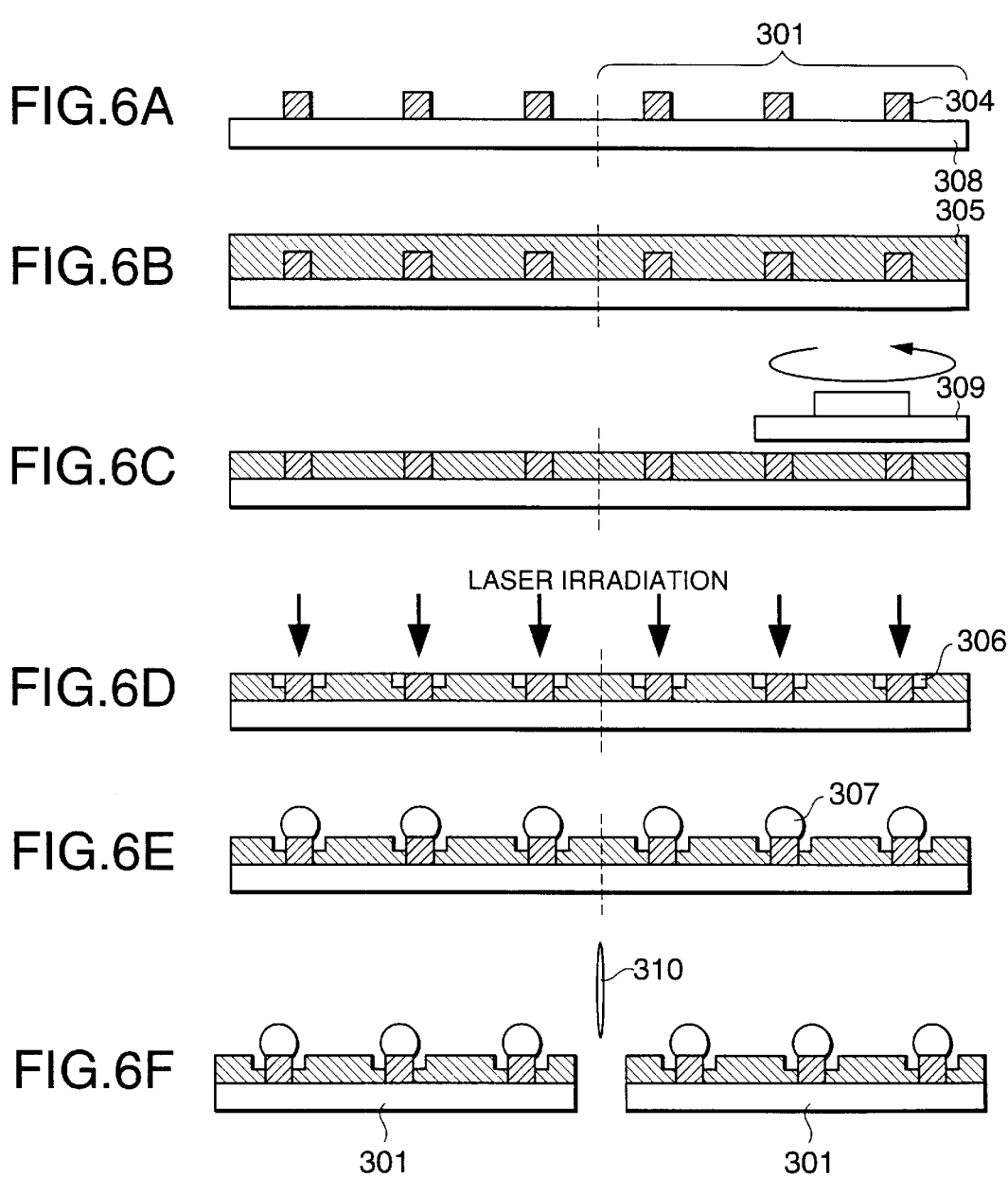

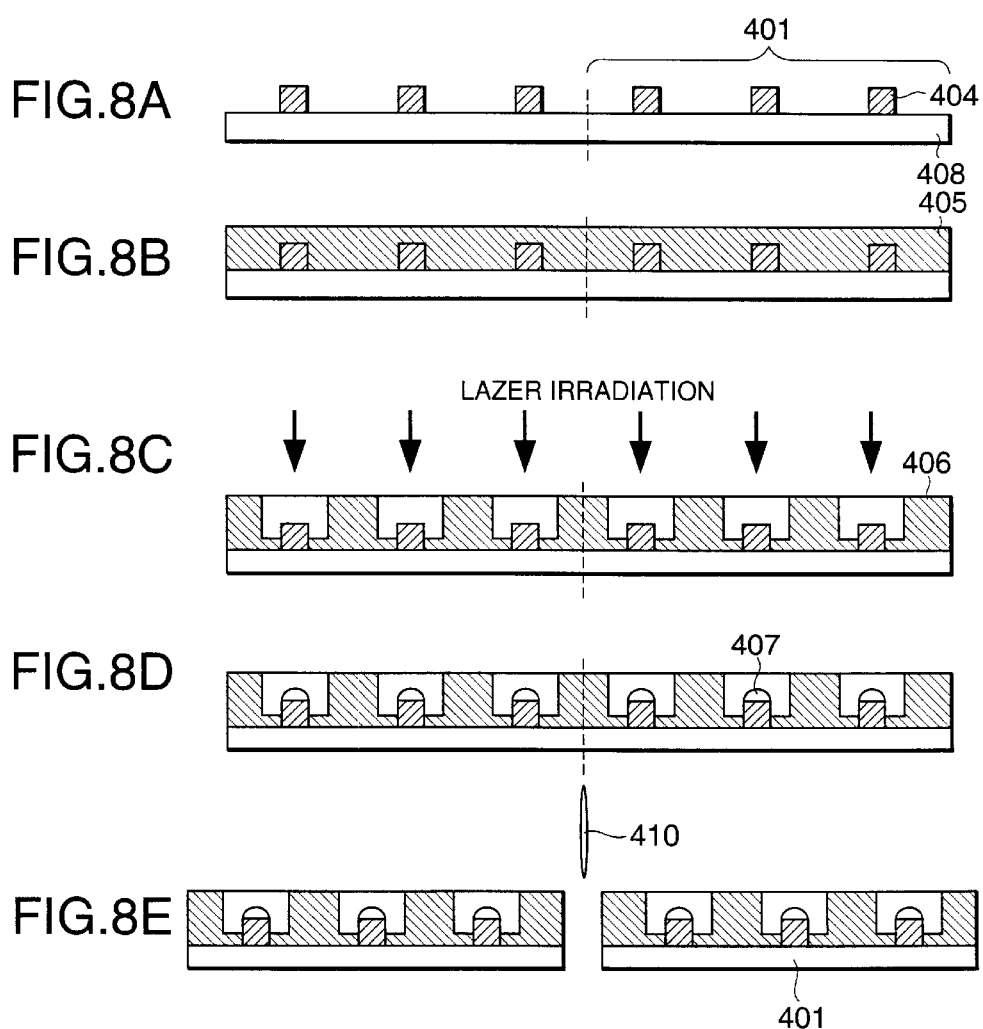

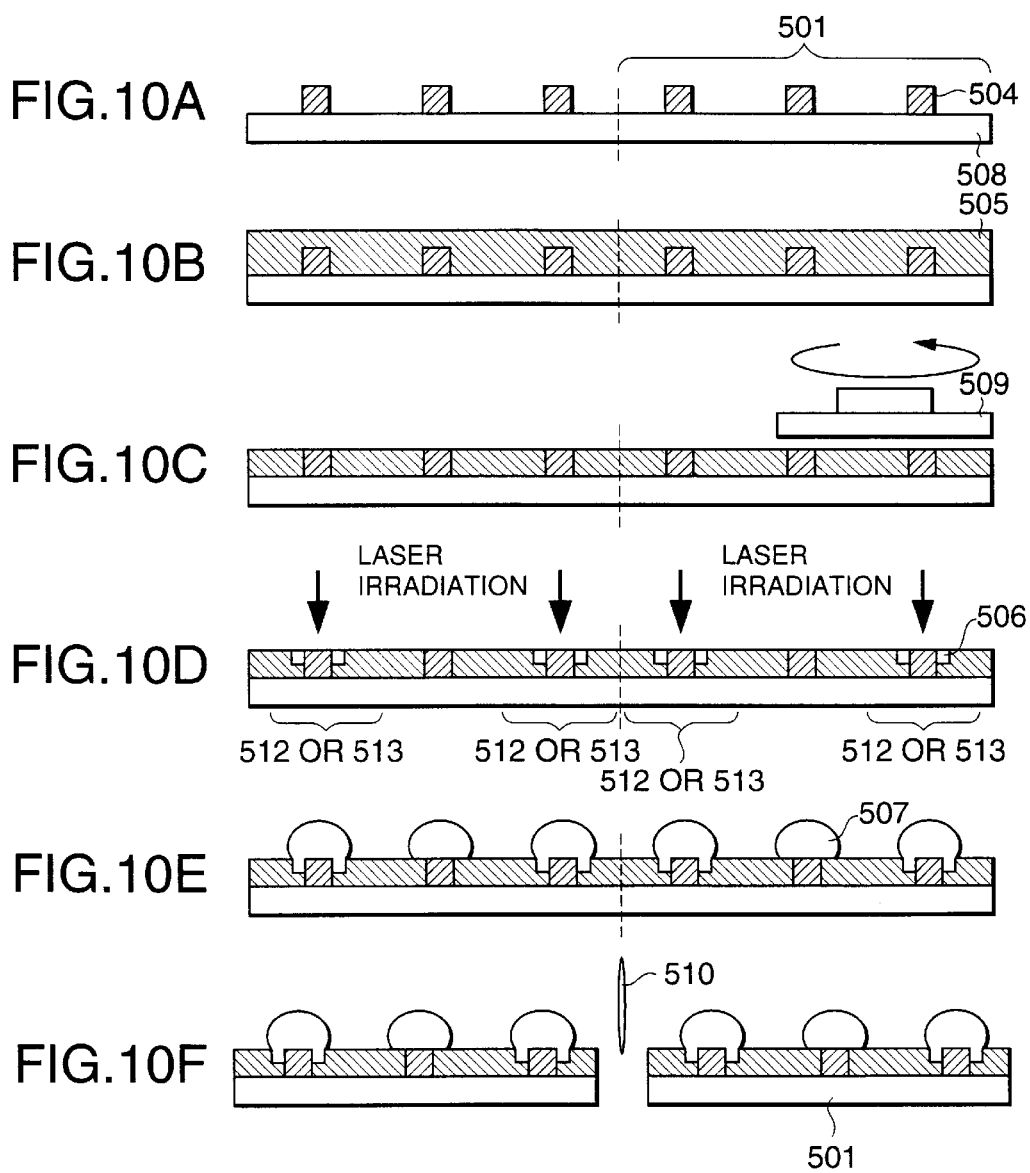

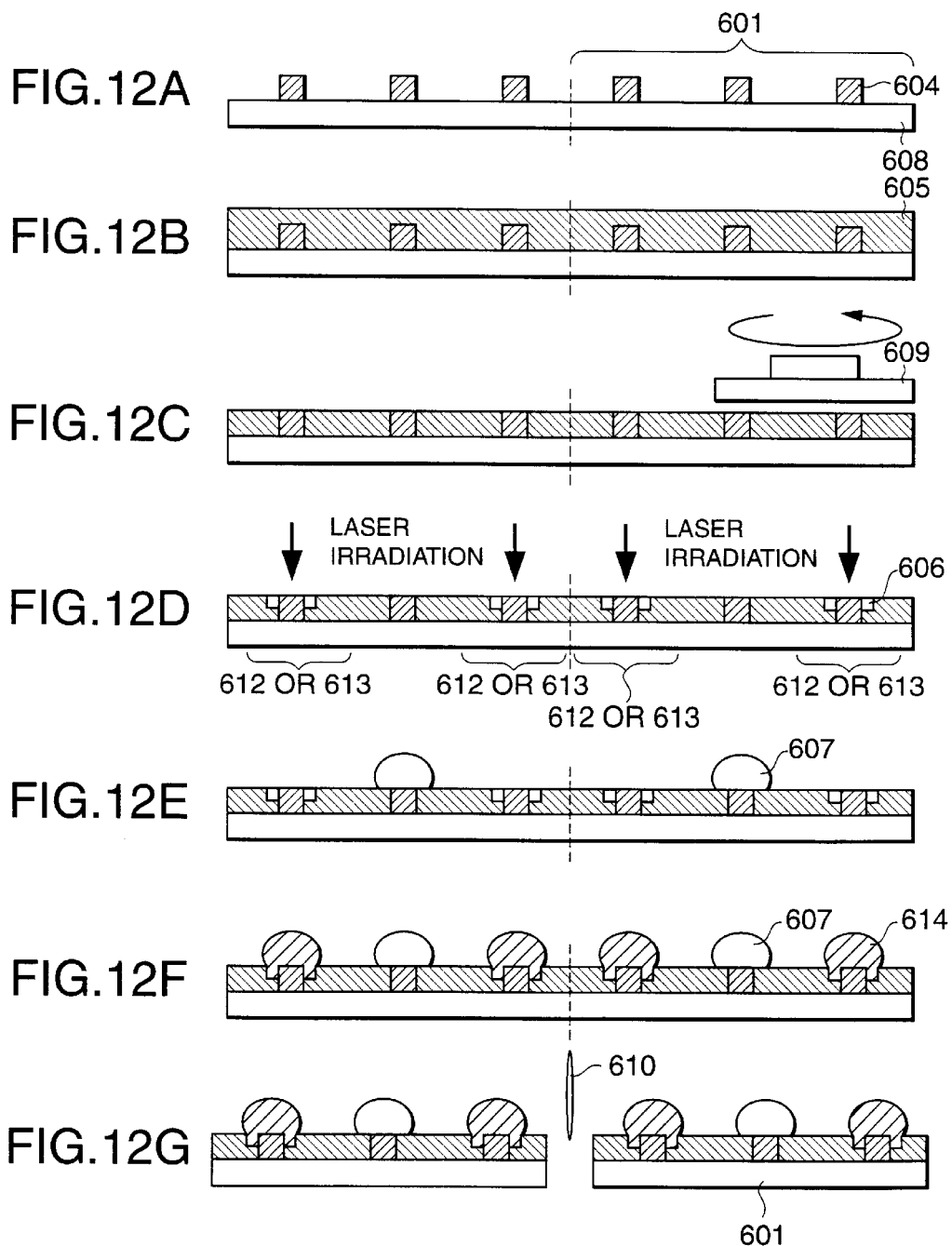

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, to a semiconductor device which is resin-encapsulated in a semiconductor wafer state and a method of fabricating the semiconductor device. Thus, the invention deals with such a semiconductor device as described above having high reliability for interconnection and a method of fabricating the semiconductor device.

2. Description of the Related Art

Portable equipment have lately come into widespread use at a rapid pace, and this has been accompanied by increasing demands for semiconductor devices mounted therein, which are thinner in thickness, smaller in size, and lighter in weight than conventional ones. Thereupon, a number of packaging technologies have been proposed in order to cope with such demands.

As one of such technologies, a chip size package (referred to hereinafter as CSP) equivalent or substantially equivalent in size to a semiconductor chip with an integrated circuit formed thereon has been developed.

There has been available a conventional CSP wherein a rewiring made of Cu, to be connected to each of electrode pads of a semiconductor chip, is formed, terminals called posts, to be connected to the rewiring, are formed for redisposing the electrode pads, the surface of the semiconductor chip is encapsulated with resin to a height of each of the terminals, and a metallic electrode such as a solder ball etc. is provided at the tip of each of the terminals, exposed out of the resin.

In a method of fabricating the CSP, a polyimide layer is first formed over a semiconductor wafer, a rewiring pattern made of Cu, to be connected to an electrode pad of a plurality of semiconductor chips formed on the semiconductor wafer, is formed, and terminals called posts, to be connected to respective rewirings, are formed, thereby redisposing the electrode pads. Subsequently, the entire surface of the semiconductor wafer with the terminals formed thereon is resin-encapsulated, and after curing of resin, a resin is abraded to the extent that the tips of the respective terminals are exposed. Furthermore, the exposed tip of each of the terminals is provided with a metallic electrode such as a solder ball etc. before dicing the semiconductor wafer into separated pieces for individual semiconductor chips.

However, when a temperature cycle test is repeatedly conducted on such a CSP as described above after it is mounted on a substrate, there arises a possibility of cracks occurring to the metallic electrodes such as the solder balls etc. This is attributable to a large difference in thermal expansivity between the CSP and the substrate, which results in concentration of stress in a bonding portion between the metallic electrode and the post. An alternative cause may be a small area of bonding between the respective metallic electrodes and the respective terminals of the CSP due to a narrow spacing between the terminals, which results in a reduced bonding force between the metallic electrode and the post.

SUMMARY OF THE INVENTION

It is an object of the invention to provide a semiconductor device having high reliability for interconnection and a method of fabricating the semiconductor device.

To this end, the invention provides a semiconductor device comprising a semiconductor chip having a plurality of electrode pads formed on the upper surface thereof, a terminal formed on the upper surface of the semiconductor chip, electrically connected to each of the electrode pads, a resin formed on the upper surface of the semiconductor chip, encapsulating the terminal such that the terminal is exposed out of the resin to the extent of a predetermined height, and an electroconductor formed to be connected to the terminal.

Further, the present invention provides a method of fabricating the semiconductor device comprising a step of forming terminals on a plurality of chips formed on a semiconductor wafer, respectively, each of said terminals being electrically connected to an electrode pad of each of the chips, a step of forming a resin on the upper surface of the semiconductor wafer, on the side of the terminals, so as to encapsulate the terminals, a step of exposing the side wall face of the terminal by removing a portion of the resin on the terminal and around the same, and a step of dicing the semiconductor wafer into separated pieces for the respective chips.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 2A to 2G are views, each illustrating a method of fabricating the semiconductor device according to the first embodiment of the invention;

FIGS. 3A to 3D are sectional views, each showing a second embodiment of a semiconductor device according to the invention;

FIGS. 4A to 4E are views, each illustrating a method of fabricating the semiconductor device according to the second embodiment of the invention;

FIGS. 6A to 6F are views, each illustrating a method of fabricating the semiconductor device according to the third embodiment of the invention;

FIGS. 8A to 8E are views, each illustrating a method of fabricating the semiconductor device according to the fourth embodiment of the invention;

FIGS. 10A to 10F are views, each illustrating a method of fabricating the semiconductor device according to the fifth embodiment of the invention;

FIGS. 12A to 12G are views, each illustrating a method of fabricating the semiconductor device according to the sixth embodiment of the invention.

DETAILED DESCRIPTION OF THE INVENTION

Figure 1A:
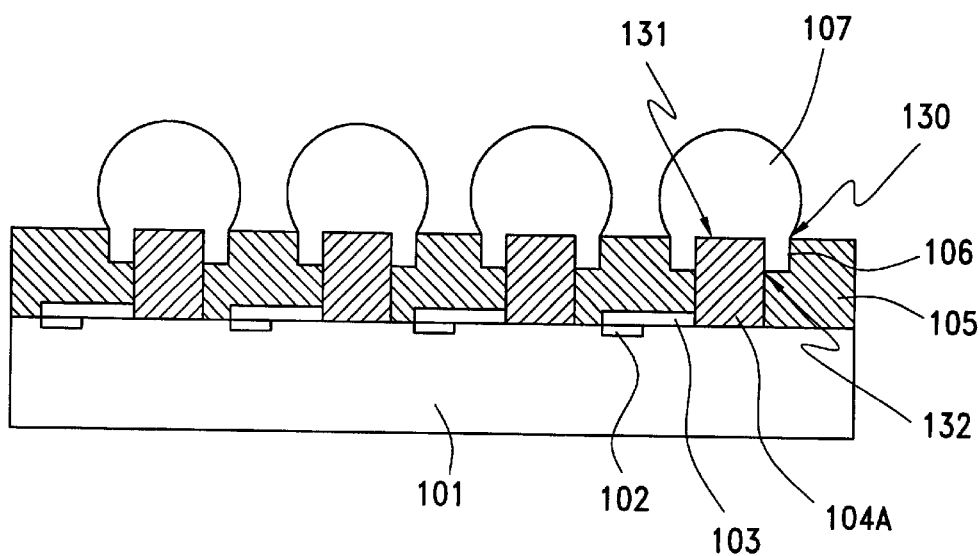
FIGS. 1A and 1B are sectional views, each showing a first embodiment of a semiconductor device according to the invention.

FIG. 1A is a sectional view showing a first embodiment of a semiconductor device according to the invention. In FIG. 1A, electrode pads 102, made of aluminum, to be electrically connected to integrated circuits, respectively, are formed over a semiconductor chip 101 with the integrated circuits formed thereon. The electrode pads 102 are exposed out of openings formed in a protective film (not shown) made up of a nitride film etc. for protection of the integrated circuits formed on the semiconductor chip 101.

Further, a polyimide layer (not shown) is formed over the semiconductor chip 101, and a rewiring 103 made of Cu, to be connected to each of the electrode pads 102, is formed over the polyimide layer. Further, a post 104A made of Cu, serving as a terminal, is connected to each of the respective electrode pads 102 via the rewiring 103, thereby redisposing the electrode pads 2. In this case, the post 104A has a height about 100 μm, having the diameter about 250 μm, while a spacing between the posts 4 is in the order of 500 μm.

In FIG. 1A, a resin 105 for encapsulating the rewirings 103 and the posts 104A is formed on the surface of the semiconductor chip 101 to the extent equivalent to the dimension of the semiconductor chip 101. The resin 105 has a thickness substantially equivalent to the height of each of the posts 104A, that is, about 100 μm. Furthermore, a groove 106 having a width in the range of about 30 to 50 μm is formed in the resin 105, around each of the posts 104A. As a result, the topmost surface and the side wall face of the post 104A are in states of exposure from the resin 105, so that the post 104A is exposed to the same extent as the depth of the groove 106. A solder ball 107 serving as a metallic electrode is formed so as to be bonded with the topmost surface and the side wall face of each of the posts 104A, exposed out of the resin 105.

In this case, an extent to which the respective posts 104A are exposed out of the resin 105 can be regulated by adjusting the depths of the respective grooves 6, and the depths thereof are preferably in the range of 20 to 50, taking into consideration a range wherein the solder ball 107 can be formed so as to be bonded with the side wall face of the each of posts 4, which is exposed.

Figure 1B:
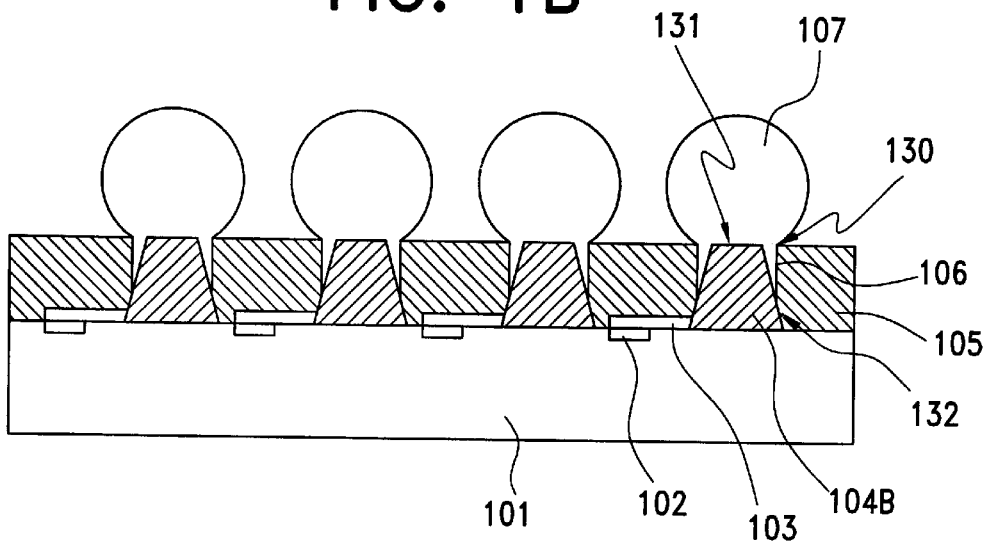

Further, in this embodiment of the invention, as shown in FIG. 1B, if the diameter of each of the posts 104B is reduced to, for example, 150 μm, flexibility of the post 104B is enhanced, so that the effect of a difference in thermal expansivity between the post 104B and a substrate on which a semiconductor device is mounted is moderated, and also the groove 106 can be rendered larger in width. Accordingly, it is expected that the solder ball 107 can then be formed with greater ease in such a way as to be bonded with the side wall face of each of the post 104B, which is exposed.

As described in the foregoing, since the solder ball 7 is bonded with not only the topmost surface of each of the post 104A or 104B, but also the side wall face thereof, bond strengths between the respective posts 4 and the respective solder balls 7 are increased. Further, in the semiconductor device of the first embodiment of the invention, stress conventionally concentrated in a spot where the post is bonded with the solder ball at the time of temperature cycle test is dispersed in the boundary portion 130 between the surface of the resin 105 and the solder ball 107, the bonding portion 131 between the post 104 and the solder ball 107, and the boundary portion 132 among the post 104A or 104B, the solder ball 107 and the resin 105. Accordingly, cracks and exfoliation can be inhibited from occurring to the solder balls 7, thereby enhancing reliability for interconnection.

Next, a method of fabricating the semiconductor device according to the first embodiment of the invention is described hereinafter by referring to FIGS. 2A to 2F.

First, as shown in FIG. 2A, a polyimide layer is first formed over the semiconductor wafer 108 from which a plurality of the semiconductor chips 101 are formed, and the rewiring 103 made of Cu is formed over the polyimide layer by electroplating in such a way as to be connected to each of the electrode pads 102 of the respective semiconductor chips 101. Subsequently, the post 104 to be connected to the electrode pad 102 via the rewiring 103 is formed by electroplating. Hereupon, the post 104 is about 100 μm in height, and circular in a plan view, with the diameter about 250 μm. In the figure, the polyimide layer, the electrode pads 102 and the rewirings 103 are omitted.

As shown in FIG. 2B, the resin 105 for encapsulating the rewirings 103 and the posts 104 is formed on the entire surface of the semiconductor wafer 108. The resin 105 has a thickness in the order of 200 μm. After curing of the resin 105, the surface of the resin 105 is abraded by use of a grinding cutter 109 so as to expose the topmost surface of the respective posts 4, as shown in FIG. 2C.

As shown in FIG. 2D, laser irradiation is applied to a peripheral region of each of the posts 104, about 30 to 50 μm larger in diameter than the diameter of the posts 104. Resin around each of the posts 104 is removed through the laser irradiation, forming a groove 106 about 10 μm in width. As a result, the side wall face of each of the posts 104 is exposed. At this point in time, the respective posts 104 made of Cu reflect a laser beam and are left intact. Hereupon, a portion of each of the posts 104 is exposed out of the resin 105 to the extent ranging from 20 to 50 μm in height. If there are 100 posts, all the grooves 106 can be formed in several seconds. An extent to which the respective posts 104 are exposed out of the resin 105 can be set by regulating a volume of the resin to be removed, which is achieved by varying a duration of the laser irradiation and output thereof.

Thereafter, a mask is disposed to form a terminal electrode on the semiconductor wafer solder, and as shown in FIG. 2E, the solder ball 107 is formed in such a way as to be bonded with the topmost surface and the side wall face of each of the posts 104, exposed out of the resin 105.

Finally, as shown in FIG. 2F, the semiconductor wafer 108 is cut into separated pieces for respective semiconductor chips 101 by use of the blade 110, made up of, for example, a diamond blade.

In the foregoing step, the solder balls 107 may be formed after the semiconductor wafer 108 is rendered into separated pieces for the respective semiconductor chips 101. Furthermore, any metallic electrode having electroconductivity may be used for the solder ball 107. Further, if the resin 105 is formed over the posts 104 to a thickness in the order of several μm, there is no need of abrading the resin 105 with the use of the grinding cutter 109, and the topmost surface and the side wall face of each of the posts 104 may be exposed by removing portions of the resin 105 through the laser irradiation. In this connection, the groove 106 may be formed by irradiating a laser beam to each of the posts 104, one by one, however, all the grooves 6 may be formed together by irradiating laser beams to all the posts 104 at one time after disposing a mask, corresponding to the posts 104, in the vicinity of a laser light source, thereby further expediting the formation of all the grooves 106.

In carrying out this embodiment of the invention, by adoption of each of the posts 104 having a cross section substantially in a trapezoidal shape with the width thereof narrowing down towards the topmost surface thereof as shown in FIG. 1B, removal of portions of the resin 105, in a peripheral region of the side wall face of the post 104, is performed with greater ease when removing the resin 105 around the post 4 through the laser irradiation.

Next, a semiconductor device according to a second embodiment of the invention is described hereinafter by referring to FIGS. 3A to 3D.

In FIG. 3A, similarly to the case of the first embodiment, a polyimide layer is formed over a semiconductor chip 201, and a rewiring 203 to be connected to each of electrode pads 202 of the semiconductor chip 201 is formed over the polyimide layer, and the electrode pad 202 is connected to each of posts 204 via the rewiring 203, thereby redisposing the electrode pads 202. Hereupon, the post 204 has a height about 100 $\mu$m, and is circular in a plan view, having the diameter about 250 $\mu$m, while a spacing between the posts 4 is in the order of 500 $\mu$m.

In FIG. 3A, a resin 205 for encapsulating the rewirings 203 and the posts 204 is formed on the surface of the semiconductor chip 201 to the extent equivalent to the dimension of the semiconductor chip 201. The resin 205 has a thickness thicker than the height of each of the posts 204. In this case, the resin 205 is formed to a thickness about 200 $\mu$m. Further, a groove region 206A provided with a groove around each of the posts 204, having a width in the range of about 30 to 50 $\mu$m, is formed in the resin 205, and has a depth in the range of 120 to 150 $\mu$m. As a result, the topmost surface and the side wall face of each of the posts 204 are in states of exposure from the resin 205. Moreover, a solder ball 207A several $\mu$m in thickness is provided in such a way as to be bonded with the topmost surface and the side wall face of each of the posts 204, exposed out of the resin 205. Hereupon, an exposed portion of the post 4 falls within the range of 20 to 50 $\mu$m in height. This is set in consideration of a range within which the solder ball 207A can be formed so as to be bonded partially with the side wall face of each of the posts 204, exposed out of the resin 205.

Before mounting the semiconductor device shown in FIG. 3A on a substrate, as shown in FIG. 3B, electrode pads 221 on the substrate 220 side are provided with solder 222 beforehand, and the solder ball 207A of the semiconductor device is bonded with the top of the solder 222, whereupon the solder provided on the substrate side enters the groove region 206A of the semiconductor device, so that a solder part can build up by the height of the groove region 206A, thereby enabling reduction in distortion of the solder part, and enhancing reliability of the semiconductor device for interconnection.

Further, as with the case of the first embodiment of the invention, since in a region where the solder part is bonded with each of the posts 204, the solder is bonded with not only the topmost surface of the post 204 but also the side wall face thereof, a bond strength between the post 204 and the solder ball 207A is increased, and even if stress is developed in the region where the solder ball 207A is bonded with each of the posts 204 at the time of a temperature cycle test, cracks and exfoliation can be inhibited from occurring thereto, thereby enhancing reliability of the semiconductor device for interconnection.

Further, in the embodiment, as shown in FIG. 3C, a solder ball 207B may be formed so as to fill up a groove region 206B. For example, the solder ball 207B can be formed by applying solder to the groove region 206B without using any masks. Alternatively, as shown in FIG. 3D, solder 311 may be applied to a groove region 206C, and a solder ball 207C may then be formed on the solder 311. Here, the solder 311 and the solder ball 207C are formed to be united with each other, but these may be separately formed. For example, the solder 311 and the solder ball 207C are formed by first forming the groove region 206C through laser irradiation, disposing a mask with an opening in a spot corresponding to the groove region 206C on the semiconductor chip 201, and then applying solder to the groove region 206C, the amount of the solder being equal to the thickness of the mask. Subsequently, by removing the mask, the solder ball 207C is formed by the solder, which is exposed out of the resin surface by an extent equivalent to the thickness of the mask.

Especially with the semiconductor device shown in FIG. 3D, since the height of the solder is equal to the addition of the solder 311 with the solder ball 207C reducing the distortion of the solder, reliability of the semiconductor device for interconnection can be further enhanced.

With the embodiment, similarly to the case of the first embodiment, each of the posts 204 shown in FIGS. 3A to 3D may have a cross section substantially in a trapezoidal shape with the width thereof narrowing down towards the topmost surface thereof.

Furthermore, with the embodiment, if the diameter of each of the posts 204 is reduced to, for example, 150 $\mu$m, flexibility of the post 204 is enhanced, so that the effect of a difference in thermal expansivity between the post 204 and a substrate on which the semiconductor device is mounted is moderated, and also the grooves 206A, 206B and 206C can be rendered larger in width. Accordingly, it is expected that the solder ball 207A, 207B or 207C can be formed with greater ease so as to be bonded with the side wall face of the post 204, which is exposed.

Next, a method of fabricating the semiconductor device according to the second embodiment the invention is described hereinafter by referring to FIGS. 4A to 4E.

First, as shown in FIG. 4A, a polyimide layer is formed over the semiconductor wafer 208 from which a plurality of semiconductor chips 201 are formed, and the rewiring 203 made of Cu is formed over the polyimide layer by electroplating in such a way as to be connected to the electrode pad 202 of each of the semiconductor chips 201. Subsequently, the post 204 to be connected to the electrode pad 202 via the rewiring 203 is formed by electroplating. Hereupon, the post 204 is about 100 $\mu$m in height, and circular in a plan view, with the diameter about 250 $\mu$m. In the figure, the polyimide layer, the electrode pads 202 and the rewirings 203 are omitted.

Subsequently, as shown in FIG. 4B, the resin 205 for encapsulating the rewirings 203 and the posts 204 is formed on the entire surface of the semiconductor wafer 208. The resin 205 has a thickness in the order of 200 $\mu$m. After curing of the resin 205, similarly to the case of the first embodiment, as shown in FIG. 4C, laser irradiation is applied to a peripheral region of each of the posts 204, about 30 to 50 $\mu$m larger in diameter than the diameter of the post 204. Resin on and around the post 204 is then removed through the laser irradiation, forming a groove region 206 about 120 to 150 $\mu$m in depth. As a result, the topmost surface and the side wall fade of the post 204 are partially exposed. At this point in time, the respective posts 204 made of Cu reflect a laser beam and are left intact. Hereupon, a portion of each of the posts 204 is exposed out of the resin 205 to the extent ranging from 20 to 50 $\mu$m in height. If there are 100 posts, all the groove regions 206 can be formed in several seconds. An extent to which each of the posts 204 is exposed out of the resin 205 can be set by regulating a volume of the resin to be removed, which is achieved by varying a duration of the laser irradiation and output thereof.

Then, as shown in FIG. 4D, a solder ball 207 several μm in thickness is formed in such a manner as to be bonded with the topmost surface and the side wall face of the post 204 exposed out of the resin 205. In this case, for example, the solder ball 207 can be formed by applying solder to the groove region 206 without using any masks.

Finally, as shown in FIG. 4E, the semiconductor wafer 208 is cut into separated pieces for the respective semiconductor chips 201 by use of the blade 210, made up of, for example, a diamond blade.

In the foregoing step, the solder ball 207 may be formed after the semiconductor wafer 208 is rendered into separated pieces for the respective semiconductor chips 201. As a result, the semiconductor device having enhanced reliability for interconnection between the posts 204 and the solder balls 207 can be fabricated.

Next, a semiconductor device according to a third embodiment of the invention is described hereinafter by referring to FIG. 5.

Figure 5:
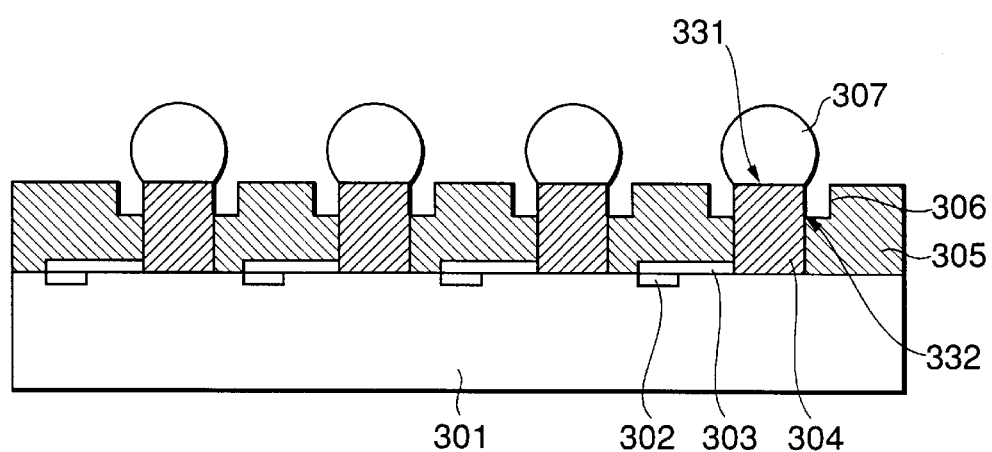
FIG. 5 is a sectional view showing a third embodiment of a semiconductor device according to the invention.

FIG. 5 is a sectional view showing a third embodiment of a semiconductor device according to the invention. In FIG. 5, electrode pads 302, made of aluminum, to be electrically connected to integrated circuits, respectively, are formed over a semiconductor chip 301 with the integrated circuits formed thereon. The electrode pads 302 are exposed out of openings formed in a protective film (not shown) made up of a nitride film etc. for protection of the integrated circuits formed on the semiconductor chip 301. Further, a polyimide layer (not shown) is formed over the semiconductor chip 301, and a rewiring 303 made of Cu, to be connected to each of the electrode pads 302, is formed over the polyimide layer. Further, a post 304 made of Cu, serving as a terminal, is connected to each of the electrode pads 302 via the rewiring 303, thereby redisposing the electrode pads 302. In this case, the post 304 has a height about 100 μm, having the diameter about 250 μm, while a spacing between the posts 304 is in the order of 500 μm.

In FIG. 5, a resin 305 for encapsulating the rewirings 303 and the posts 304 is formed on the surface of the semiconductor chip 301 to the extent equivalent to the dimension of the semiconductor chip 301. The resin 305 has a thickness substantially equivalent to the height of each of the posts 304, that is, about 100 μm. A groove 306 having a width in the range of about 30 to 50 μm is formed in the resin 305, around each of the posts 304. As a result, the topmost surface and the side wall face of the post 304 are partially in states of exposure from the resin 305, so that the side wall face of the post 304 is exposed to the same extent as the depth of the groove 306. A solder ball 307 serving as a metallic electrode is formed so as to be bonded with the topmost surface of the post 304, exposed out of the resin 305. The depth of the groove 306 is preferably in the range of 20 to 50 μm. If the height of the post is about 100 μm, supporting of the post 304 by the resin 305 in the portion of the post 304 lower by 20 to 50 μm from the topmost surface thereof causes concentrated application of stress in this portion, which is generated at the time of temperature cycle test after the semiconductor device is mounted on a substrate. As a result, stress applied to the bonding portion between the solder ball 307 and the post 304 can be reduced most efficiently. In other words, the portion of the post 304 lower by 20 to 50 μm from the topmost surface thereof can most efficiently reduce stress applied to the bonding portion between the solder ball 307 and the post 304. Even if concentrated application of stress occurs in the foregoing portion of the post 304, since the post 304 is made of metal such as Cu, a possibility of exfoliation caused by cracks etc. in the post 304 is very small.

As described in the foregoing, with the embodiment, the solder ball 307 is formed to be bonded only with the topmost surface of the post 304, and most of stress generated at the time of temperature cycle test after the semiconductor device is mounted on the substrate concentrates in the boundary portion 332 between the post 304 and the resin 305. However, since the post 304 is made of Cu, the stress applied to the bonding portion 331 between the solder ball 307 and the post 304 can be reduced more than that in the first embodiment of the invention. As a result, cracks and exfoliation can be inhibited from occurring to the solder ball 307, thereby enhancing reliability of the semiconductor device for interconnection.

Next, a method of fabricating the semiconductor device according to the third embodiment of the invention is described hereinafter by referring to FIGS. 6A to 6F.

First, as shown in FIG. 6A, a polyimide layer is formed over the semiconductor wafer 308 from which a plurality of semiconductor chips 301 are formed, and the rewiring 303 made of Cu is formed over the polyimide layer by electroplating in such a way as to be connected to each of the electrode pads 302 of the semiconductor chips 301. Subsequently, the post 304 to be connected to each of the electrode pads 302 via the rewiring 303 is formed by electroplating. Hereupon, the post 304 is about 100 μm in height, and circular in plan view, with the diameter about 250 μm. In the figure, the polyimide layer, the electrode pads 302 and the rewirings 303 are omitted.

As shown in FIG. 6B, the resin 305 for encapsulating the rewirings 303 and the posts 304 is formed on the entire surface of the semiconductor wafer 308. The resin 305 has a thickness in the order of 200 μm. After curing of the resin 305, the resin 305 is abraded by use of a grinding cutter 309 so as to expose the topmost surface of each of the posts 304 as shown in FIG. 6C.

As shown in FIG. 6D, laser irradiation is applied to a peripheral region of each of the posts 304, about 30 to 50 μm larger in diameter than the diameter of the post 304. Resin around the post 304 is removed through the laser irradiation, forming a groove 306 about 10 μm in width. As a result, the side wall face of the post 304 is exposed. At this point in time, the respective post 304 made of Cu reflect a laser beam and are left intact. Hereupon, a portion of each of the posts 304 is exposed out of the resin 305 to the extent ranging from 20 to 50 μm in height. If there are 100 posts, all the grooves 306 can be formed in several seconds. An extent to which the side wall face of the post 304 is exposed out of the resin 305 can be set by regulating a volume of the resin to be removed, which is achieved by varying a duration of the laser irradiation and output thereof.

Thereafter, a mask is disposed to form a terminal electrode on the semiconductor wafer, and as shown in FIG. 6E, the solder ball 307 is formed so as to be bonded with the topmost surface of the post 304 exposed out of the resin 305.

Finally, as shown in FIG. 6F, the semiconductor wafer 308 is cut into separated pieces for the respective semiconductor chips 301 by use of the blade 310, made up of, for example, a diamond blade.

In the foregoing step, the solder balls 307 may be formed after the semiconductor wafer 308 is rendered into separated pieces for the respective semiconductor chips 301. An any metallic electrode having electroconductivity may be used for the solder ball 307. Further, if the resin 305 is formed over the posts 304 to a thickness in the order of several μm, there is no need of abrading the resin 305 with the use of the grinding cutter 309, and the topmost surface and the side wall face of each of the posts 304 may be exposed by removing portions of the resin 305 through the laser irradiation. In this connection, the groove 306 may be formed by irradiating a laser beam to each of the posts 304, one by one, however, all the grooves 306 may be formed together by irradiating laser beams to all the posts 304 at one time after disposing a mask corresponding to each of the posts 304, in the vicinity of a laser source, thereby further expediting the formation of all the grooves 306.

Next, a semiconductor device according to a fourth embodiment of the invention is described hereinafter by referring to FIGS. 7A and 7B.

Figure 7A:
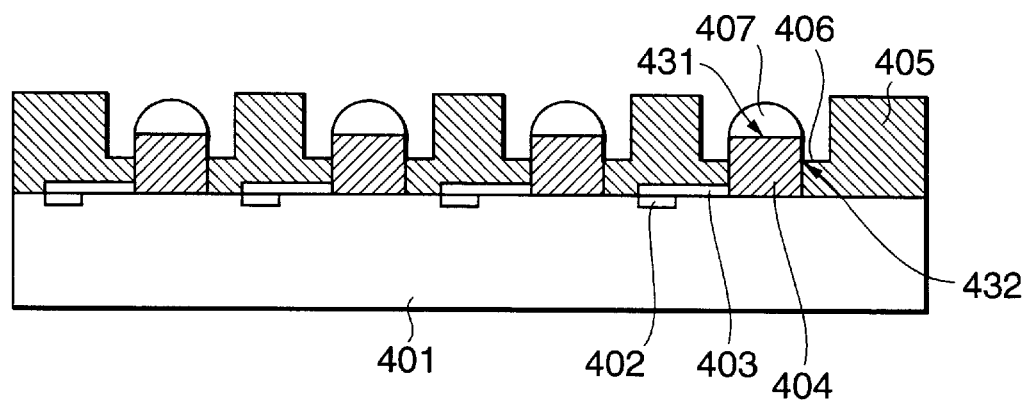
FIGS. 7A and 7B are sectional views, each showing a fourth embodiment of a semiconductor device according to the invention.

In FIG. 7A, a polyimide layer is formed over the semiconductor chip 401, and a rewiring 403 to be connected to each of electrode pads 402 of the semiconductor chip 401 is formed over the polyimide layer, and each of the electrode pads 402 is connected to each of posts 404 via the rewiring 403, thereby redisposing the electrode pads 402. Hereupon, each of the posts 404 has a height about 100 μm, and is circular in a plan view, having the diameter about 250 μm, while a spacing between the posts 404 is in the order of 500 μm.

In FIG. 7A, a resin 405 for encapsulating the rewirings 403 and the posts 404 is formed on the surface of the semiconductor chip 401 to the extent equivalent to the dimension of the semiconductor chip 401. The resin 405 has a thickness thicker than the height of each of the posts 404. In this case, the resin 405 is formed to a thickness about 200 μm. Further, a groove region 406 provided with a groove around each of the posts 404, having a width in the range of about 30 to 50 μm, is formed in the resin 405, and has a depth in the range of 120 to 150 μm. As a result, the topmost surface and the side wall face of each of the posts 404 are partially in states of exposure from the resin 405. Moreover, a solder ball 407 several μm in thickness is provided in such a way as to be bonded with the topmost surface of each of the posts 404, exposed out of the resin 405. Hereupon, an exposed portion of the post 404 falls within the range of 20 to 50 μm in height. If the height of the post is about 100 μm, supporting of the post 404 by the resin 405 in the portion of the post 404 lower by 20 to 50 μm from the topmost surface thereof causes concentrated application of stress in this portion, which is generated at the time of temperature cycle test after the semiconductor device is mounted on a substrate. As a result, stress applied to the bonding portion between the solder ball 407 and the post 404 can be reduced more efficiently. In other words, the portion of the post 404 lower by 20 to 50 μm from the topmost surface of thereof can most efficiently reduce stress applied to the bonding portion between the solder ball 407 and the post 404. Even if concentrated application of stress occurs in the foregoing region of the post 404, since the post 404 is made of metal such as Cu, a possibility of exfoliation caused by cracks etc. in the post 404 is very small.

As described in the foregoing, with the embodiment, the solder ball 407 is formed to be bonded only with the topmost surface of the post 404, and most of stress generated at the time of temperature cycle test after the semiconductor device is mounted on the substrate concentrates in the boundary portion 432 between the post 404 and the resin 405. However, since the post 404 is made of Cu, the stress applied to the bonding portion 431 between the solder ball 407 and the post 404 can be reduced more than that in the first embodiment of the invention. As a result, cracks and exfoliation can be inhibited from occurring to the solder ball 407, thereby enhancing reliability of the semiconductor device for interconnection.

Figure 7B:
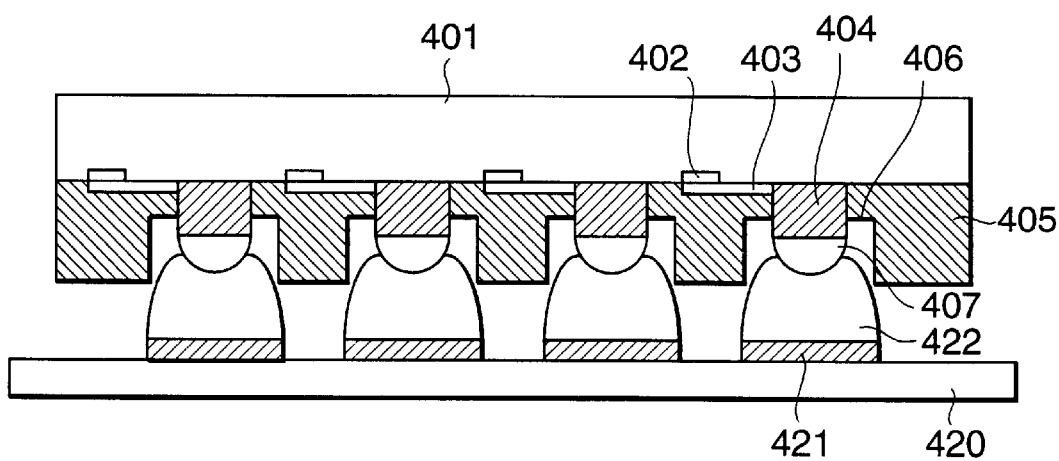

Before mounting the semiconductor device shown in FIG. 7A on the substrate, as shown in FIG. 7B, electrode pads 421 on the substrate side are provided with solder 422 beforehand, and the solder ball 407A of the semiconductor device is bonded with the top of the solder, whereupon the solder provided on the substrate side enters the groove region 406 of the semiconductor device, so that a solder part can build up by the height of the groove region 406, thereby enabling reduction in distortion of the solder part, and enhancing reliability of the semiconductor device for interconnection.

Next, a method of fabricating the semiconductor device according to the fourth embodiment of the invention is described hereinafter by referring to FIGS. 8A to 8E.

First, as shown in FIG. 8A, a polyimide layer is formed over the semiconductor wafer 408 from which a plurality of semiconductor chips 401 are formed, and the rewiring 403 made of Cu is formed over the polyimide layer by electroplating in such a way as to be connected to each of the electrode pads 402 of the semiconductor chips 401. Subsequently, the post 404 to be connected to the electrode pad 402 via the rewiring 403 is formed by electroplating. Hereupon, the post 404 is about 100 μm n height, and circular in plan view, with the diameter about 250 μm. In the figure, the polyimide layer, the electrode pads 402 and the rewirings 403 are omitted.

Then, as shown in FIG. 8B, the resin 405 for encapsulating the rewirings 403 and the posts 404 is formed on the entire surface of the semiconductor wafer 408. The resin 405 has a thickness in the order of 200 μm. After curing of the resin 405, similarly to the case of the first embodiment, as shown in FIG. 8C, laser irradiation is applied to a peripheral region of each of the posts 404, about 30 to 50 μm larger in diameter than the diameter of the post 404. Resin on and around the post 404 is removed through the laser irradiation, forming a groove region 406 about 120 to 150 μm in depth. As a result, the topmost surface and the side wall face of the post 404 are partially exposed out of the resin 405. At this point in time, the respective posts 404 made of Cu reflect a laser beam and are left intact. Hereupon, a portion of each of the posts 404 is exposed out of the resin 405 to the extent ranging from 20 to 50 μm in height. If there are 100 posts, all the groove regions 406 can be formed in several seconds. An extent to which each of the posts 404 is exposed out of the resin 405 can be set by regulating a volume of the resin to be removed, which is achieved by varying a duration of the laser irradiation and output thereof.

Then, as shown in FIG. 8D, the solder ball 407 is formed to a thickness of several μm in such a way as to be bonded with the topmost surface of each of the posts 404 exposed out of the resin 405. In this case, the solder ball 407 can be formed, for example, by applying solder to the groove region 406 without using any masks.

Finally, as shown in FIG. 8E, the semiconductor wafer 408 is cut into separated pieces for the respective semiconductor chips 401 by use of the blade 410, made up of, for example, a diamond blade.

In the foregoing step, the solder ball 407 may be formed after the semiconductor wafer 408 is cut into separated pieces for the respective semiconductor chips 401.

As a result, the semiconductor device having enhanced reliability for interconnection between the post 404 and the solder ball 407 can be fabricated.

Next, a semiconductor device according to a fifth embodiment of the invention is described hereinafter by referring to FIGS. 9A and 9B.

Figure 9A:
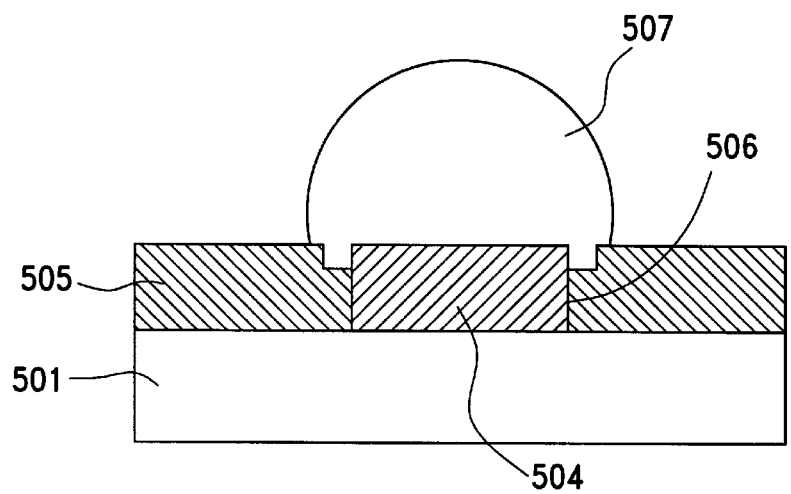
FIGS. 9A and 9B are sectional and plan views, each showing a fifth embodiment of a semiconductor device according to the invention.
Figure 9B:
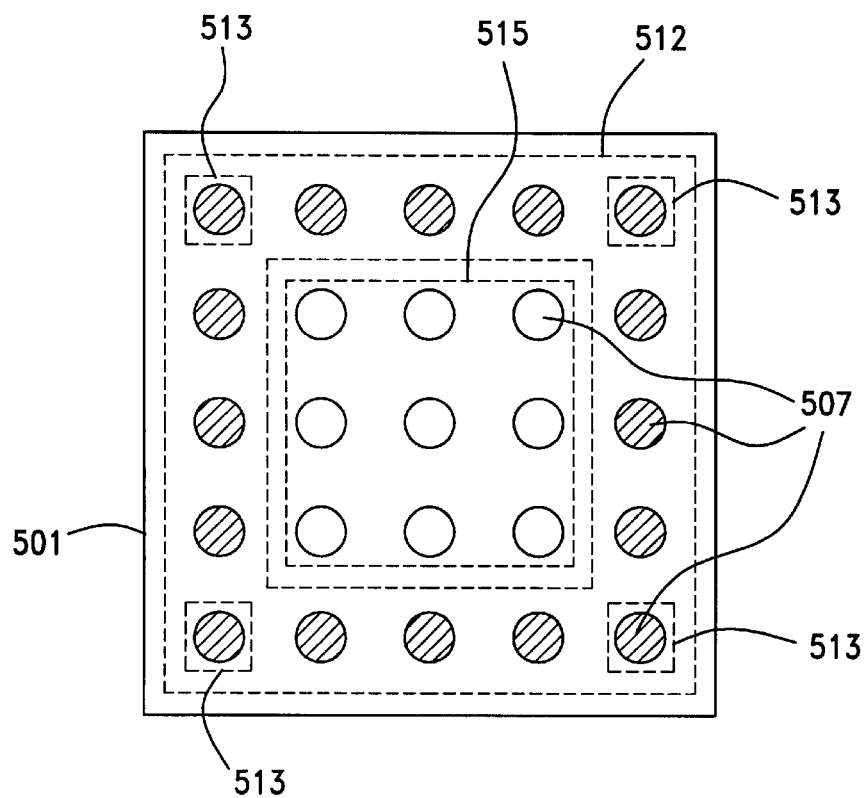

FIG. 9A is a sectional view showing a terminal electrode in the peripheral or corner region of the semiconductor device according to the fifth embodiment, and FIG. 9B is a plan view showing the entire semiconductor device of the fifth embodiment.

In the embodiment, a solder ball 507 partially connected to the topmost surface and the side wall face of a post 504 (described later) is applied to a terminal electrode formed in the peripheral region 512 or each corner region 513 of the semiconductor device, as shown in FIG. 9A. On the other hand, a terminal electrode in the center region 515 of the semiconductor device is formed by connecting the solder ball 507 to the post 504 without forming any groove regions 507 (described later).

In the sectional view of FIG. 9A, electrode pads 502, made of aluminum, to be connected electrically to integrated circuits, respectively, are formed over a semiconductor device 501 with the integrated circuits formed thereon. The electrode pads 502 are exposed out of openings formed in a protective film (not shown) made up of a nitride film etc. for protection of the integrated circuits formed on the semiconductor chip 501. Further, a polyimide layer (not shown) is formed over the semiconductor chip 501, and a rewiring 503 made of Cu, to be connected to each of the electrode pads 502, is formed over the polyimide layer. Further, a post 504 made of Cu, serving as a terminal, is connected to each of the electrode pads 502 via the rewiring 503, thereby redisposing the electrode pads 502. In this case, the post 504 has a height about 100 μm, having the diameter about 250 μm, while a spacing between the posts 504 is in the order of 500 μm. A resin 505 for encapsulating the rewirings 503 and the posts 504 is formed on the surface of the semiconductor chip 501 to the extent equivalent to the dimension of the semiconductor chip 501. The resin 505 has a thickness substantially equivalent to the height of each of the posts 504, that is, about 100 μm. Moreover, a groove region 506 having a width in the range of about 30 to 50 μm is formed in the resin 505, around each of the posts 504. As a result, the topmost surface and the side wall face of each of the posts 504 are partially in states of exposure from the resin 505, so that the posts 504 is exposed to the same extent as the depth of the groove region 506. A solder ball 507 serving as a metallic electrode is formed so as to be bonded partially with the topmost surface and the side wall face of each of the posts 504, exposed out of the resin 505. In this case, the extent to which each of the posts 504 is exposed can be regulated by adjusting the depth of the groove region 506, and is preferably in the range of 20 to 50 μm in depth, taking into consideration a range wherein the solder ball 407 can be formed so as to be bonded with the side wall face of each of the posts 504, which is exposed.

At the time of the temperature cycle test of the semiconductor device, greater thermal stress is applied in the peripheral region 512 or the corner region 513 than in the center region 515 of the semiconductor device. Accordingly, as in the case of the embodiment, if the terminal electrode is in the peripheral region 512 or the corner region 515 of the semiconductor region, to which greater thermal stress is applied, in such a manner that the solder ball 507 is connected partially to the topmost surface and the side wall face of the post 504, cracks and exfoliation can be inhibited from occurring to the solder ball 507, thereby enhancing reliability of the semiconductor device for interconnection. Moreover, the foregoing formation of the external electrode occurs only in the peripheral region 512 or the corner region 515 of the semiconductor device, reliability of the semiconductor device for interconnection can be enhanced, while suppressing reduction in production efficiency of the semiconductor device.

Furthermore, with the embodiment, similarly to the foregoing third embodiment, in the peripheral region 512 or the corner region 515 of the semiconductor device, to which greater thermal stress is applied, the solder ball 507 serving as a metallic electrode can be formed in such a way as to be bonded with the topmost surface of the exposed post 504. As a result, as in the case of the third embodiment, the occurrence of cracks in the solder ball can be suppressed more effectively, thereby further enhancing reliability of the semiconductor device for interconnection.

Next, a method of fabricating the semiconductor device according to the fifth embodiment is described hereinafter by referring to FIGS. 10A to 10F.

First, as shown in FIG. 10A, a polyimide layer is formed over the semiconductor wafer 508 from which a plurality of semiconductor chips 501 are formed, and the rewiring 503 made of Cu is formed over the polyimide layer by electroplating in such a way as to be connected to each of the electrode pads 502 of the semiconductor chips 501. Subsequently, the post 504 to be connected to each of the electrode pads 502 via the rewiring 503 is formed by electroplating. Hereupon, the post 504 is about 100 μm in height, and circular in view, with the diameter about 250 μm. In the figure, the polyimide layer, the electrode pads 502 and the rewirings 503 are omitted.

As shown in FIG. 10B, the resin 505 for encapsulating the rewirings 503 and the posts 504 is formed on the entire surface of the semiconductor wafer 508. The resin 505 has a thickness in the order of 200 μm. After curing of the resin 505, as shown in FIG. 10C, the resin 505 is abraded by use of a grinding cutter 509 so as to expose the topmost surface of each of the posts 504.

As shown in FIG. 10D, laser irradiation is applied only to the post 504 existing in the peripheral region 512 or the corner region 515 of each semiconductor chip 501, about 30 to 50 μm larger in diameter than the diameter of the post 504. Resin around the post 504 existing in the peripheral region 512 or the corner region 515 of the semiconductor chip 501 through the laser irradiation, forming a groove region 506 about 20 to 50 μm in depth. As a result, the side wall face of the post 504 existing in the peripheral region 512 or the corner region 515 of the semiconductor chip 501 is partially exposed. At this point in time, the respective posts 504 made of Cu reflect a laser beam and left intact. An extent to which each of the posts 504 is exposed out of the resin 505 can be set by regulating a volume of the resin to be removed, which is achieved by varying a duration of the laser irradiation and output thereof.

Thereafter, as shown in FIG. 10F, a mask for forming the terminal electrode is disposed on top of the semiconductor wafer, and as shown in FIG. 10E, the solder ball 507 is formed in such a way as to be bonded partially with the topmost surface and the side wall face of the post 504 exposed out of the resin 505.

Finally, as shown in FIG. 10F, the semiconductor wafer 508 is cut into separated pieces for the respective semiconductor chips 501 by use of a blade 510, made up of, for example, a diamond blade.

In the foregoing fifth embodiment, after the semiconductor wafer 508 is cut into separated pieces for the respective semiconductor chips 501, the terminal electrode with the solder ball 507 connected partially to the topmost surface and the side wall face of the post 504 may be formed in the peripheral region 512 or the corner region 515 of the semiconductor device. Furthermore, any metallic electrode having electroconductivity may be used for the solder ball 507.

Further, if the resin 505 is formed over the posts 504 to a thickness in the order of several μm, there is no need of abrading the resin 505 with the use of the grinding cutter 509, and the topmost surface and the side wall face of each of the posts 504 may be partially exposed by removing the resin 505 through the laser irradiation. In this connection, the groove region 506 may be formed by irradiating a laser beam to each of the posts 504, one by one, however, all the groove regions 506 may be formed together by irradiating laser beams to all the posts 504 at one time after disposing a mask corresponding to each o the posts 504, in the vicinity of the laser light source.

As described in the foregoing, with the fifth embodiment, the semiconductor device is fabricated by forming only the terminal electrode in the region, to which greater thermal stress is applied at the time of the temperature cycle test of the semiconductor device, i.e., in the peripheral region 512 or the corner region 515 of the semiconductor device 501, in such a manner that the solder ball 507 is bonded partially with the topmost surface and the side wall face of the post 504. Accordingly, the semiconductor device having enhanced reliability for the interconnection of the terminal electrode can be fabricated while suppressing reduction in production efficiency.

Next, a semiconductor device according to a sixth embodiment of the invention is described hereinafter by referring to FIGS. 11A and 11B.

Figure 11A:
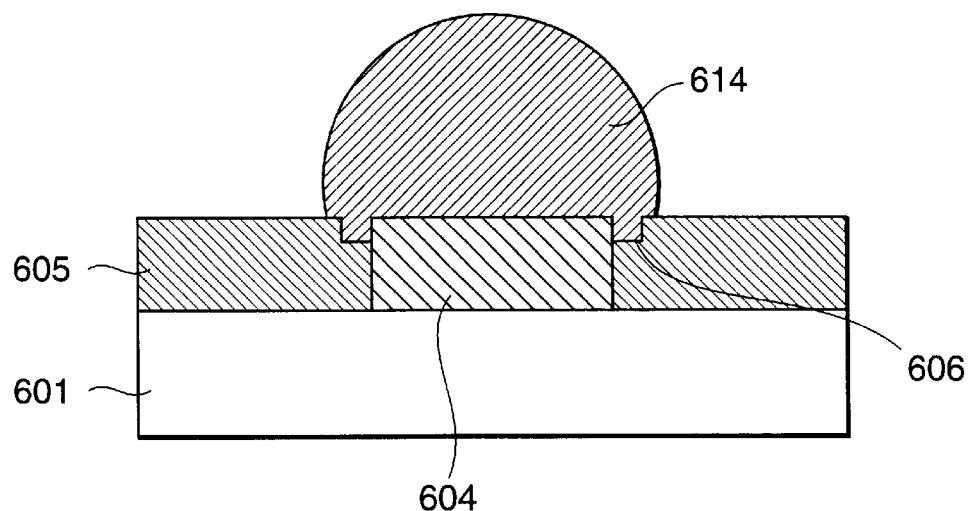
FIGS. 11A and 11B are sectional and plan views, each showing a sixth embodiment of a semiconductor device of the invention.
Figure 11B:
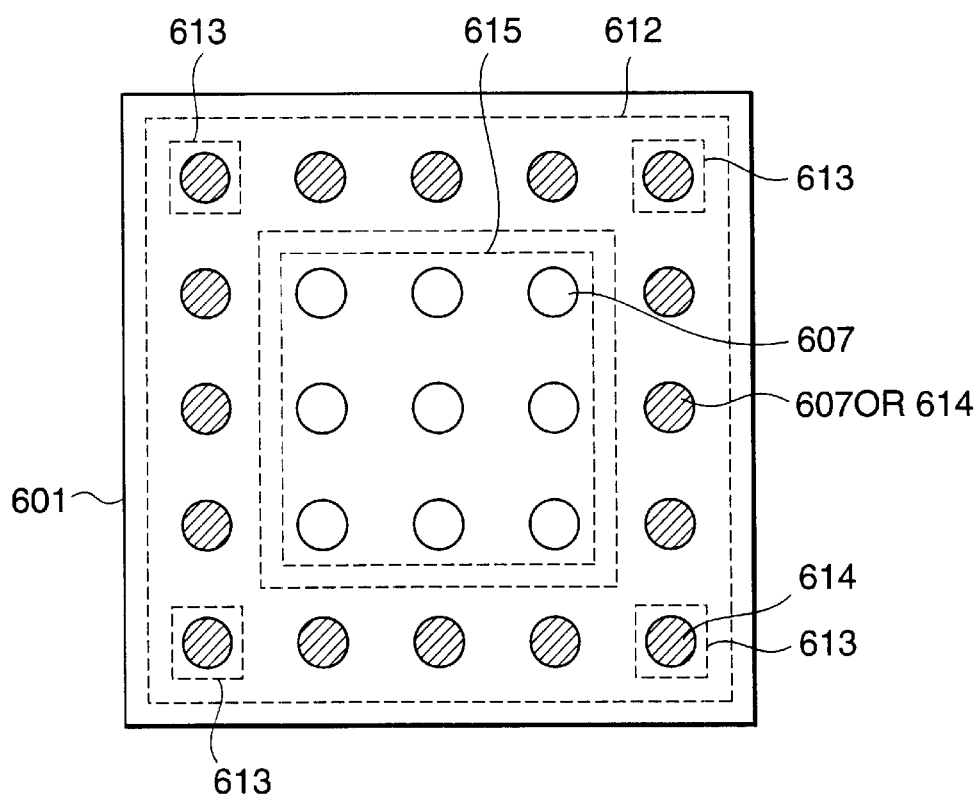

FIG. 11A is a sectional view showing the semiconductor device according to the sixth embodiment, and FIG. 11B is a plan view showing the semiconductor device according to the sixth embodiment.

In the embodiment, a bump made of a thermoplastic resin is formed in a post 604 existing in the peripheral region 612 or the corner region 615 of the semiconductor device, and in the other region, that is, in a post 604 located in the center region 615 of the semiconductor device, a terminal electrode is formed by a solder ball.

In the sectional view of FIG. 11A, electrode pads 602, made of aluminum, to be electrically connected to integrated circuits, respectively, are formed over a semiconductor chip 601 with the integrated circuits formed thereon. The electrode pads 602 are exposed out of openings formed in a protective film (not shown) made up of a nitride film etc. for protection of the integrated circuits formed on the semiconductor chip 601. Further, a polyimide layer (not shown) is formed over the semiconductor chip 601, and a rewiring 603 made of Cu, to be connected to each of the electrode pads 602, is formed over the polyimide layer, thereby redisposing the electrode pads 602. Each of the posts 604 has a height about 100 μm and a diameter about 250 μm. and a spacing between the posts 604 is in the order of 500 μm. A resin 605 for encapsulating the rewirings 603 and the posts 604 is formed on the semiconductor chip 601 to have a size equal to that of the same. The resin 605 has a thickness substantially equivalent to the height of the post 604, that is, in the order of 100 μm. In the resin 605 around the post 604, a groove region 606 having a with ranging from 30 to 50 μm is formed. In other words, the topmost surface and the side wall face of each of the posts 604 are partially in states of exposure from the resin 605. The side wall face of the post 605 is exposed to an extent equivalent to the height of the groove region 606.

In the embodiment, a bump 614 made of a thermoplastic resin is connected to the post 604 formed in the peripheral region 612 or the corner region 613 of the semiconductor device, and a terminal electrode is connected by a solder ball 607 to the other region, that is, the post 604 formed in the center region 615 of the semiconductor device. Hereupon, the extent to which the post 604 is exposed out of the resin 605 can be set by regulating the depth of the groove region 606, and the depth of the groove region 606 is preferably in the range of 20 to 50 μm, taking into consideration the range within which the bump 614 made of a thermoplastic resin or the terminal electrode so as to be bonded with the exposed side wall face of the post 604.

When a temperature cycle test is performed for the semiconductor device, greater thermal stress is applied in the peripheral region 612 or the corner region 613 than in the center region 615 of the semiconductor device. If the semiconductor device is mounted on a substrate, reduction occurs in the viscosity of the thermoplastic resin at the temperature of the mounting time to adhere the semiconductor device to the substrate, and when the temperature returns to a normal level, the semiconductor device is fixed to the substrate. In such a case, if a bump made of a thermoplastic resin is formed beforehand in the peripheral region 612 or the corner region 613 of the semiconductor device as in the case of the embodiment, then eve if greater thermal stress is applied in the peripheral region 612 or the corner region 613 of the semiconductor device, since the bump formed therein is made of the thermoplastic resin and the bump is bonded with the post 604, the topmost surface and the side wall face thereof being partially exposed, reliability for interconnection between the semiconductor device and the substrate can be considerably enhanced. Moreover, the foregoing formation of the bump made of the thermoplastic resin is carried out only for the peripheral region 612 or the corner region 613 of the semiconductor device. Accordingly, reliability of the semiconductor device for interconnection can be enhanced, while suppressing reduction in production efficiency thereof.

With the embodiment, similarly to the case of the third embodiment of the invention, in the peripheral region 612 or the corner region 613 of the semiconductor device, to which greater thermal stress is applied, the bump 614 made of the thermoplastic resin can be formed in such a way as to be bonded with the topmost surface of the post 604. In this way, as in the case of the third embodiment, reliability of the semiconductor device for interconnection can be further enhanced.

Next, a method of fabricating the semiconductor device according to the sixth embodiment of the invention is described hereinafter by referring to FIGS. 12A to 12G.

First, as shown in FIG. 12A, a polyimide layer is formed over the semiconductor wafer 608 from which a plurality of semiconductor chips 601 are formed, and the rewiring 603 made of Cu is formed over the polyimide layer by electroplating in such a way as to be connected to each of the electrode pads 602 of the semiconductor chip 601. Subsequently, the post 604 to be connected to each of the electrode pads 602 via the rewiring 603 is formed by electroplating. Hereupon, the post 604 is about 100 μm in height, and circular in plan view, with the diameter about 250 μm. In the figure, the polyimide layer, the electrode pads 602 and the rewirings 603 are omitted.

As shown in FIG. 12B, the resin 605 for encapsulating the rewirings 603 and the posts 604 is formed on the entire surface of the semiconductor wafer 608. The resin 605 has a thickness in the order of 200 μm. After curing of the resin 605, as shown in FIG. 12C, the resin 605 is abraded by use of a grinding cutter 609 so as to expose the topmost surface of each of the posts 604.

As shown in FIG. 12D, laser irradiation is applied to a peripheral region of each of the posts 604, about 30 to 50 μm larger in diameter than the diameter of the post 604. Resin around the post 604 is removed by the laser irradiation, thereby forming the groove region 606 having a depth in the range of 20 to 50 μm. As a result, the side wall face of the post 604 is partially exposed. At this point in time, the respective posts 604 made of Cu reflect a laser beam and are left intact. The extent to which each of the posts 604 is exposed out of the resin 605 can be set by regulating a volume of resin to be removed, which is achieved by varying a duration of the laser irradiation and output thereof.

Thereafter, a mask for forming a terminal electrode is disposed on the post 604 existing in the center region of the semiconductor chip 601, and as shown in FIG. 12E, the solder ball 607 is formed so as to be bonded partially with the topmost surface and the side wall face of the post 604 exposed out of the resin 605. After the formation of the solder ball 607, a mask for forming a bump 614 made of a thermoplastic resin is disposed on the post 604 existing in the peripheral region 612 or the corner region 613 of the semiconductor chip 601, and as shown in FIG. 12F, the bump 614 made of the thermoplastic resin is formed so as to be bonded partially with the topmost surface and the side wall face of the post 604 exposed out of the resin 605.

Finally, as shown in FIG. 12G, the semiconductor wafer 608 is cut into separated pieces for respective semiconductor chips 601 by use of the blade 610, made up of, for example, a diamond blade.

In the foregoing sixth embodiment, in portions of the topmost surface and the side face of the post 604, the bump 614 made of the thermoplastic resin may be formed in the peripheral region 612 or the corner region 613 of the semiconductor device after the semiconductor wafer 608 is cut into separated pieces for the respective semiconductor chips 601. Further, if the resin 605 formed on the post 604 has a thickness in the order of several μm, there is no need of abrading the resin 605 by use of a grinding cutter 609, and the resin 605 is removed through the laser irradiation, thereby exposing portions of the topmost surface and the side wall face of the post 604.

As described in the foregoing, with the sixth embodiment, the bump 614 made of the thermoplastic resin is formed only in the region, to which greater thermal stress is applied at the time of the temperature cycle test for the semiconductor device, that is, in the peripheral region 612 or the corner region 613 of the semiconductor device 601. Accordingly, the semiconductor device having enhanced reliability of interconnection with the substrate can be fabricated while suppressing reduction in production efficiency.

While the invention has been described with reference to preferred embodiments thereof by way of example, it is our intention that the invention be not limited thereto. It will be obvious to those skilled in the art that various changes and other embodiments of the invention may be made by referring to the foregoing description. It is therefore to be intended to cover in the appended claims all such changes and embodiments as fall within the true spirit and scope of the invention.

What is claimed is:

1. A semiconductor device, comprising:
a semiconductor chip having an electrode pad formed on an upper surface thereof;
a terminal having a top end with a top surface, a side wall face, and a bottom end with a bottom surface, the terminal being disposed at a peripheral region of the upper surface of the semiconductor chip and being electrically connected to the electrode pad;
a resin encapsulating the upper surface of the semiconductor chip and a portion of the side wall face of the terminal, the portion of the side wall face encapsulated by the resin being spaced apart from the top end of the terminal; and
an electroconductor body on the top surface of the terminal,
wherein the terminal and the electroconductor body are separate, individual elements that are joined to one another.

2. The semiconductor device according to claim 1, wherein the electroconductor body is connected to both the top surface and the side wall face of the terminal.

3. The semiconductor device according to claim 1, wherein the electroconductor body is connected only to the top surface of the terminal.

4. The semiconductor device according to claim 1, wherein the peripheral region is a corner region of the upper surface of the semiconductor chip.

5. The semiconductor device according to claim 1, wherein the terminal has a height that is within a range of 20 μm to 50 μm.

6. The semiconductor device according to claim 1, the resin has a top surface that lies substantially in a plane, and wherein the top surface of the terminal is substantially in the same plane as the top surface of the resin.

7. The semiconductor device according to claim 1, wherein the electroconductor body has a major portion that is substantially spherical.

8. A semiconductor device, comprising:
a semiconductor chip having an upper surface, the upper surface having a central region and a peripheral region;
a first electrode pad formed on the central region of the chip;
a second electrode pad formed on the peripheral region of the chip;
a first terminal having a top end with a first top surface and having a first side wall face, the first terminal being disposed on the central region of the chip and being connected to the first electrode pad;
a second terminal having a top end with a second top surface and having a second side wall face, the second terminal being disposed on the peripheral region of the chip and being connected to the second electrode pad;
a resin on the upper surface of the chip, the resin encapsulating the first side wall face of the first terminal and a portion of the second side wall face of the second terminal, the portion of the second side face wall that is encapsulated by the resin being spaced apart from the second top surface of the second terminal, the resin having a groove which leaves another portion of the second side wall face unencapsalated by resin;
a first electroconductor body on the first top surface of the first terminal; and
a second electroconductor body on the second top surface of the second terminal, wherein the first terminal and the first electroconductor body are separate, individual elements that are joined to one another; and wherein the second terminal and the second electroconductor body are also separate, individual elements that are joined to one another.

9. The semiconductor device according to claim 8, wherein the second electroconductor body is connected to both the second top surface and the second side wall face of the second terminal.

10. The semiconductor device according to claim 8, wherein the first electroconductor body is connected only to the first top surface of the first terminal.

11. The semiconductor device according to claim 8, wherein the peripheral region is a corner region of the upper surface of the chip.

12. The semiconductor device according to claim 8, wherein the first and second terminals have a height that is within a range of 20 µm to 50 µm.

13. The semiconductor device according to claim 8, wherein the resin has a top surface that lies substantially in a plane, and wherein the first and second top surfaces of the first and second terminals are substantially in the same plane as the top surface of the resin.

14. The semiconductor device according to claim 8, wherein the first and second electroconductor bodies have major portions that are substantially spherical.

15. A semiconductor device, comprising:

a semiconductor chip having an electrode pad formed on an upper surface thereof;

a post made from a first substance that is electrically conductive, the post having a top end with a top surface, a bottom end with a bottom surface, and a side wall face extending between the top and bottom surfaces, the post being disposed on the upper surface of the chip at a position spaced laterally apart from the electrode pad, with the bottom surface of the post facing the upper surface of the chip;

a rewiring conductor electrically connecting the electrode pad to the post;

a resin encapsulating the upper surface of the chip, the electrode pad, the rewiring conductor, and a first portion of the side wall face of the post, the resin having an annular groove around the top end of the post, so that a second portion of the side wall face of the post at the top end thereof is not encapsulated with resin; and a body made from a second substance that is different from the first substance, the body being joined to the top surface of the post and to the second portion of the side wall face of the post.

16. The semiconductor device of claim 15, wherein the second substance is solder.

17. The semiconductor device of claim 16, wherein the body is a solder ball.

18. The semiconductor device of claim 15, wherein the side wall face of the post has a substantially cylindrical shape.

19. The semiconductor device of claim 15, wherein the post has a substantially trapezoidal shape in a plane passing through the top and bottom surfaces of the post.

20. The semiconductor device of claim 15, wherein the resin has a surface that lies substantially in a plane, wherein the groove extends from the plane to a groove bottom located between the plane and the upper surface of the chip, and wherein the top surface of the post is substantially flat and lies substantially in the plane.

21. The semiconductor device according to claim 1, wherein the terminal is made of a first metal and the electroconductor body is made of a second metal that is different from the first metal.

22. The semiconductor device according to claim 21, wherein the first and second terminals are made of a first metal, and the first and second electroconductor bodies are made of a second metal that is different from the first metal.

* * * * *